(12) United States Patent
Jang et al.

(10) Patent No.: US 11,910,529 B2
(45) Date of Patent: *Feb. 20, 2024

(54) DISPLAY DEVICE

(71) Applicant: Samsung Display Co., LTD., Yongin-si (KR)

(72) Inventors: Sehui Jang, Yongin-si (KR); Chongguk Lee, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/088,383

(22) Filed: Dec. 23, 2022

(65) Prior Publication Data

US 2023/0126027 A1  Apr. 27, 2023

Related U.S. Application Data

(63) Continuation of application No. 17/125,405, filed on Dec. 17, 2020, now Pat. No. 11,540,392.

(30) Foreign Application Priority Data

Feb. 13, 2020 (KR) .................. 10-2020-0017287

(51) Int. Cl.
*H05K 1/11* (2006.01)
*H05K 1/02* (2006.01)
(Continued)

(52) U.S. Cl.
CPC .......... *H05K 1/118* (2013.01); *H05K 1/0268* (2013.01); *H05K 1/189* (2013.01);
(Continued)

(58) Field of Classification Search
CPC .... H05K 1/118; H05K 1/0268; H10K 59/131; G02F 1/13452
(Continued)

(56) References Cited

U.S. PATENT DOCUMENTS

| 9,869,717 B2 | 1/2018 | Lim et al. | |
| 2018/0069067 A1* | 3/2018 | Oh | H10K 59/131 |
| 2019/0281692 A1* | 9/2019 | Jeon | H10K 59/131 |

FOREIGN PATENT DOCUMENTS

| KR | 10-1445117 | 10/2014 |
| KR | 10-1979749 | 5/2019 |
| KR | 10-2009827 | 8/2019 |

* cited by examiner

*Primary Examiner* — Andargie M Aychillhum
(74) *Attorney, Agent, or Firm* — KILE PARK REED & HOUTTEMAN PLLC

(57) ABSTRACT

A display device is provided and includes a display panel including a display area that displays an image and a pad area disposed at least at a side of the display area, and a flexible circuit film electrically connected to the pad area. The flexible circuit film includes connection pads, a first measurement pad, and a second measurement pad. The connection pads are arrayed in a first direction and inclined with respect to a reference line extending in a second direction different from the first direction, the first measurement pad is disposed adjacent to a first side of the connection pads, and the second measurement pad is disposed adjacent to a second side of the connection pads. The connection pads are between the first measurement pad and the second measurement pad.

14 Claims, 15 Drawing Sheets

(51) Int. Cl.
 *H05K 1/18* (2006.01)
 *H01L 25/18* (2023.01)
 *G02F 1/1345* (2006.01)
 *H10K 59/131* (2023.01)

(52) U.S. Cl.
 CPC .......... *G02F 1/13452* (2013.01); *H01L 25/18* (2013.01); *H05K 2201/094* (2013.01); *H05K 2201/09418* (2013.01); *H05K 2201/09781* (2013.01); *H05K 2201/10128* (2013.01); *H05K 2201/10136* (2013.01); *H10K 59/131* (2023.02)

(58) Field of Classification Search
 USPC .......................................................... 361/749
 See application file for complete search history.

DISPLAY DEVICE

CROSS-REFERENCE TO RELATED APPLICATION(S)

This application is a continuation application of U.S. patent application Ser. No. 17/125,405, filed Dec. 17, 2020, now U.S. Pat. No. 11,540,392 issued on Dec. 27, 2022, the disclosure of which is incorporated herein by reference in its entirety. U.S. patent application Ser. No. 17/125,405 claims priority to and benefits of Korean Patent Application No. 10-2020-0017287 under 35 U.S.C. § 119, filed on Feb. 13, 2020, in the Korean Intellectual Property Office, the entire contents of which are incorporated herein by reference.

BACKGROUND

1. Technical Field

The disclosure herein relates to a display device, and more specifically, to a display device capable of improving connection reliability of a flexible circuit film and a display panel.

2. Description of the Related Art

Various types of display devices may be used for providing image information, and a display device may include a display panel for displaying an image and a flexible circuit film combined to the display panel and for providing a driving signal to the display panel. The display panel may include a display area in which the image may be displayed, and panel pads may be disposed in the outskirts of the display area in order to provide the driving signal to a display unit on which the image may be displayed.

Moreover, the display pads may be electrically connected to the flexible circuit film to receive the driving signal through the flexible circuit film. In the flexible circuit film, connection pads may be provided which may be disposed in correspondence to the panel pads. Due to a process error in the flexible circuit film, misalignment may occur between the connection pads and the display pads.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device in which the connection reliability may be improved between a flexible circuit film and a display panel.

An embodiment provides a display device that may include a display panel including a display area that displays an image and a pad area disposed at least at a side of the display area; and a flexible circuit film electrically connected to the pad area.

In an embodiment, the flexible circuit film may include connection pads, and first and second measurement pads. The connection pads may be arrayed in a first direction and inclined with respect to a reference line extending in a second direction different from the first direction.

In an embodiment, the first measurement pad may be disposed adjacent to a first side of the connection pads, and the second measurement pad may be disposed adjacent to a second side of the connection pads. The connection pads may be disposed between the first measurement pad and the second measurement pad.

In an embodiment, the flexible circuit film may include dummy pads disposed adjacent to the connection pads, wherein the dummy pads may be inclined with respect to the reference line.

In an embodiment, the dummy pads may include a first dummy pad disposed between the first measurement pad and a connection pad disposed first in the first direction among the connection pads; and a second dummy pad disposed between the second measurement pad and a connection pad disposed last in the first direction among the connection pads.

In an embodiment, the dummy pads may include a first dummy pad disposed adjacent to the first measurement pad; and a second dummy pad disposed adjacent to the second measurement pad.

In an embodiment, the first measurement pad and the second measurement pad may be parallel to the reference line.

In an embodiment, the connection pads may include a first connection pad group having a first slope with respect to the reference line and comprising first connection pads disposed at a first side of the reference line; and a second connection pad group having a second slope with respect to the reference line and comprising second connection pads disposed at a second side of the reference line.

In an embodiment, the connection pads may further include a third connection pad group having a third slope with respect to the reference line and disposed between the reference line and the first connection pad group; and a fourth connection pad group having a fourth slope with respect to the reference line and disposed between the reference line and the second connection pad group.

In an embodiment, the third slope may be smaller than the first slope, and the fourth slope may be smaller than the second slope.

In an embodiment, each of the first measurement pad and the second measurement pad may have a rectangular or square shape in a plan view.

In an embodiment, the display panel may include display pads disposed in the pad area corresponding to the connection pads, wherein the display pads may be inclined with respect to the reference line.

In an embodiment, the display device may further include a driving chip disposed on the flexible circuit film, the driving chip outputting a driving signal that drives the display panel, wherein the driving signal may be provided to the display panel through the connection pads.

In an embodiment, a film package may include a base film, connection pads, test pads, and first and second measurement pads. The base film may include a test area and a cutting area. The connection pads may be disposed in the cutting area of the base film, and the test pads may be disposed in the test area of the base film. The connection pads may be arrayed in the first direction and may be inclined with respect to a reference line extending in a second direction different from the first direction. The test pads may be electrically connected to the connection pads.

In an embodiment, the first measurement pad may be disposed in the test area of the base film and disposed adjacent to a connection pad disposed first in the first direction among the connection pads. The second measurement pad may be disposed in the test area of the base film and disposed adjacent to a connection pad disposed last in the first direction among the connection pads. The first measurement pad and the second measurement pad may be disposed between the test pads and the connection pads.

In an embodiment, the cutting area may be defined by a cutting line, the first measurement pad and the second measurement pad may be separated from the cutting line by a first interval, the test pads may be separated from the cutting line by a second interval, and the first interval may be smaller than the second interval.

In an embodiment, the first interval may be greater than about 0 μm and smaller than about 500 μm.

In an embodiment, the first measurement pad and the second measurement pad may be parallel to the reference line.

In an embodiment, a film package may include a base film, connection pads, test pads, and first and second measurement pads. The base film may include a test area and a cutting area.

In an embodiment, the connection pads may be disposed in the cutting area of the base film, and the test pads may be disposed in the test area of the base film. The connection pads may be arrayed in a first direction and may be inclined with respect to a reference line extending in a second direction different from the first direction. The test pads may be electrically connected to the connection pads.

In an embodiment, the first measurement pad may be disposed in the cutting area of the base film and adjacent to a connection pad disposed first in the first direction among the connection pads. The second measurement pad may be disposed in the cutting area of the base film and adjacent to a connection pad disposed last in the first direction among the connection pads.

In an embodiment, the film package may further include dummy pads disposed adjacent to the connection pads, wherein the dummy pads may be inclined with respect to the reference line.

In an embodiment, the dummy pads may include a first dummy pad disposed between the first measurement pad and the first connection pad; and a second dummy pad disposed between the second measurement pad and the last connection pad.

In an embodiment, the dummy pads may include a first dummy pad disposed adjacent to the first measurement pad; and a second dummy pad disposed adjacent to the second measurement pad.

In an embodiment, the first measurement pad and the second measurement pad may be parallel to the reference line.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
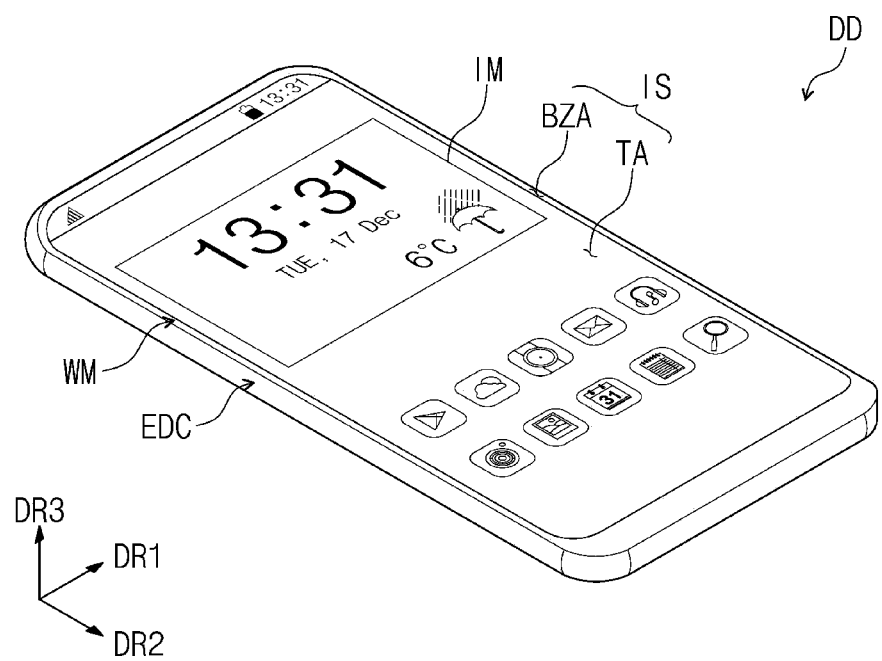
FIG. 1 is a perspective view of a display device according to an embodiment.

Hereinafter, embodiments will be explained in detail with reference to the accompanying drawings.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, an element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other layer, film, region, substrate, or area, or element, or intervening layers, films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, or elements, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or at a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component or may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

As used herein, the term "unit" or "module" denotes a structure or element as illustrated in the drawings and as described in the specification. However, the disclosure is not limited thereto. The term "unit" or "module" is not to be limited to that which is illustrated in the drawings.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 2:
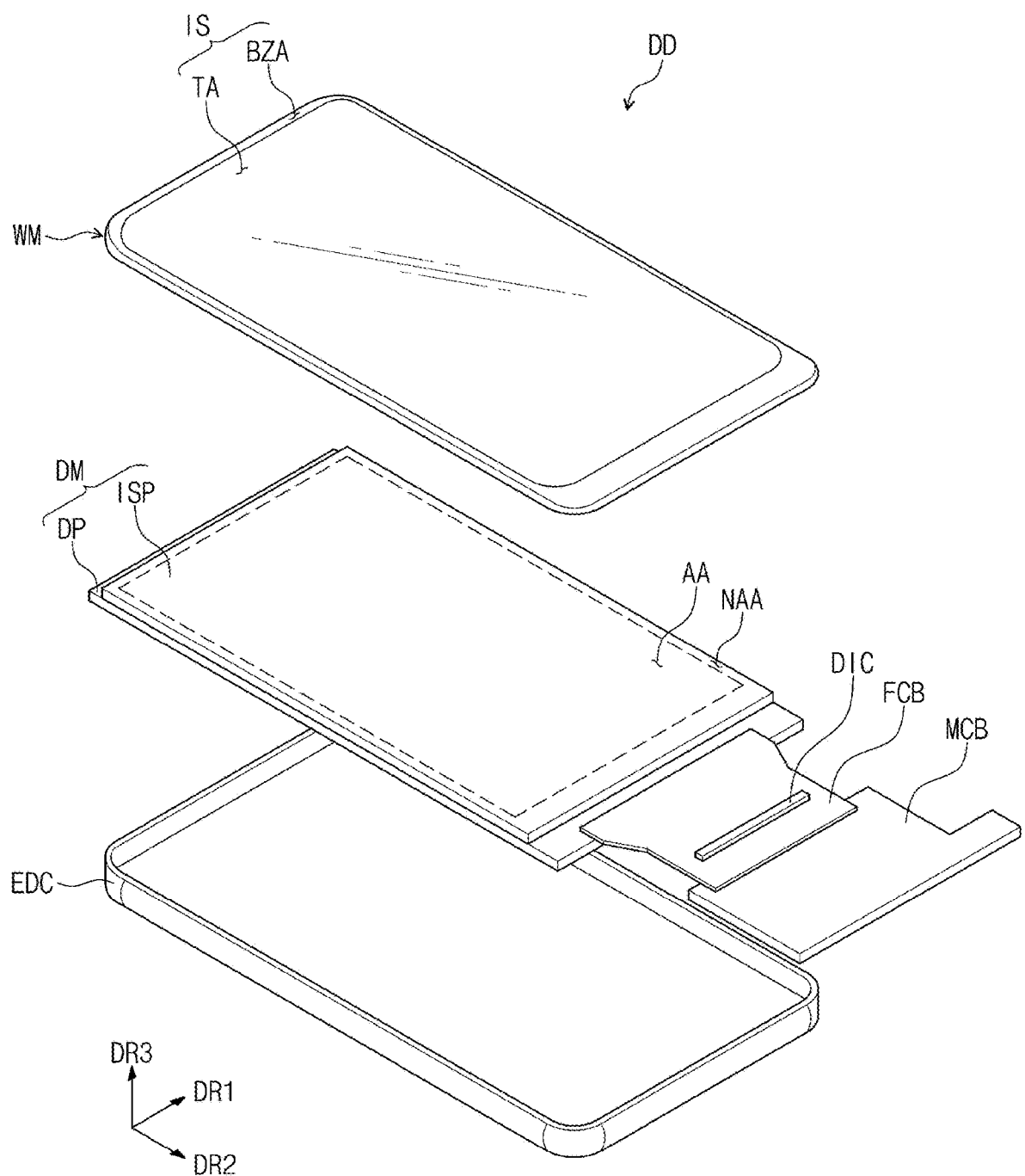
FIG. 2 is an exploded perspective view of a display device according to an embodiment.

FIG. 1 is a perspective view of a display device according to an embodiment, and FIG. 2 is an exploded perspective view of a display device according to an embodiment.

With reference to FIGS. 1 and 2, a display device DD may be a device activated according to an electrical signal. The display device DD may include various types of devices. For example, the display device DD may be applied to an electronic device such as a smart watch, a computer (such as a tablet, a notebook computer), a smart television, or the like within the spirit and the scope of the disclosure.

The display device DD may display an image IM on a display surface IS, which may be parallel to a first direction DR1 and a second direction DR2, towards a third direction DR3. The display surface IS on which the image IM may be displayed may correspond to the front surface of the display device DD. The image IM may include a still image as well as a moving image.

In an embodiment, on the basis of a direction in which the image IM may be displayed, a front surface (or an upper surface) and a rear surface (or a lower surface) of each member may be defined. The front surface and the rear surface may be opposed to each other in the third direction DR3, and normal directions of the front surface and the rear surface may be parallel to the third direction DR3.

The separation distance between the front surface and the rear surface of the display device DD in the third direction DR3 may correspond to the thickness in the third direction DR3 of the display device DD. On the other hand, directions indicated by the first to third directions DR1, DR2, and DR3 are relative concepts and may be changed to or refer to other directions.

The display device DD may detect an external input applied from the outside. The external input may include various types of inputs provided from outside of the display device DD. The external input may be provided in various types.

For example, the external input may include an external input (for example, hovering) closely applied to or applied adjacent to the display device DD at a prescribed distance as well as a contact with a portion of the body, such as a hand, of the user. The user input may have various types such as force, pressure, temperature, or light, for example, within the spirit and the scope of the disclosure.

The front surface (i.e., the display device IS) of the display device DD may be divided into a transmission area TA and a bezel area BZA. The transmission area TA may be an area in which the image IM may be displayed. A user may visually recognize the image IM through the transmission area TA. In an embodiment, the transmission area TA is illustrated to be in a substantially rectangular shape with round edges. However, this is merely an example, and the transmission area TA may have various shapes and is not limited to any one embodiment.

The bezel area BZA may be adjacent to the transmission area TA. The bezel area BZA may have a prescribed color. The bezel area BZA may surround or may be adjacent to the transmission area TA. Accordingly, the shape of the transmission area TA may be substantially defined by the bezel area BZA. However, this is merely an example, and the bezel area BZA may be disposed adjacent to only one side of the transmission area TA. The display device DD according to an embodiment may include various embodiments, and is not limited to any one embodiment.

As illustrated in FIG. 2, the display device DD may include a window WM, a display module DM, and an external case EDC. The display module DM may include a display panel DP and an input sensing unit ISP.

The window WM may be composed of a transparent material that may transmit an image. For example, the window WM may be formed of glass, sapphire, plastic, or the like within the spirit and the scope of the disclosure. The window WM is illustrated to have a single layer, but an embodiment is not limited thereto. The window WM may include layers. Moreover, although not illustrated, the bezel area BZA of the display device DD may be substantially provided as an area in which a material including a prescribed color may be printed in one area of the window WM. As an example, the window WM may include a light shielding pattern that may define the bezel area BZA. The light shielding pattern may be a colored organic film and be formed by, for example, a coating technique.

The display panel DP according to an embodiment may be a liquid crystal panel DP or a light emitting display panel, but is not particularly limited thereto. For example, the light emitting display panel may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod.

The display panel DP may be flexible. Herein, "flexible" may include bendable characteristics including all from a completely foldable structure to a bendable structure at a several nanometer level. For example, the display panel DP may be a curved display panel or a foldable display panel. As an example, the display panel DP may be rigid.

According to FIG. 2, the input sensing unit ISP may be directly disposed on the display panel DP. According to an embodiment, the input sensing unit ISP may be formed or disposed on the display panel DP in a continuous process. In other words, in a case that the input sensing unit ISP is directly disposed on the display panel DP, an adhesive film may not be disposed between the input sensing unit ISP and the display panel DP. However, an embodiment is not limited thereto. In other words, the adhesive film may be disposed between the input sensing unit ISP and the display panel DP. The input sensing unit ISP may not be manufactured in a consecutive process with the display panel DP, and may be fixed on the top surface of the display panel DP by means of the adhesive film after being manufactured through a separate process from the display panel DP.

The display panel DP may generate an image and the input sensing unit ISP may acquire coordinate information on an external input (for example, a touch event).

The display module DM may display an image according to an electrical signal, and transmit and receive information on the external input. The display module DM may include an active area AA and a non-active area NAA. The active area AA may include an area from which an image provided from the display module DM may be transmitted.

The non-active area NAA may be adjacent to the active area AA. For example, the non-active area NAA may surround or may be adjacent to the active area AA. However, this is merely an example, and the non-active area NAA may have various shapes and is not limited to any one embodiment. According to an embodiment, the active area AA of the display module DM may correspond to at least a portion of the transmission area TA.

The display module DM may include a main circuit board MCB, a flexible circuit film FCB, and a driving chip DIC.

The main circuit board MCB may be electrically connected to the flexible circuit film FCB to be electrically connected to the display panel DP. The main circuit board MCB may include driving elements. The driving elements may include a circuit unit that may drive the display panel DP.

The flexible circuit film FCB may be electrically connected to the display panel DP to electrically connect the display panel DP and the main circuit board MCB. The driving chip DIC may be mounted on the flexible circuit film FCB.

The driving chip DIC may include driving elements, for example, a data driving circuit, that may drive pixels of the display panel DP. The number of the flexible circuit film FCB according to an embodiment is illustrated as one, but the embodiment is not limited thereto. The flexible circuit film FCB may be provided in plural to be electrically connected to the display panel DP.

FIG. 2 illustrates a structure in which the driving chip DIC may be mounted on the flexible circuit film FCB, but an embodiment is not limited thereto. For example, the driving chip DIC may be directly mounted on the display panel DP. For example, a portion of the display panel DP, in which the driving chip DIC may be mounted, may be bent and disposed in the rear side of the display module DM.

The input sensing unit ISP may be electrically connected to the main circuit board MCB through the flexible circuit film FCB. However, an embodiment is not limited thereto. In other words, the display module DM may include a separate flexible circuit film that may electrically connect the input sensing unit ISP with the main circuit board MCB.

The external case EDC may accommodate the display module DM. The external case EDC may be combined with the window WM to contribute to the appearance of the display device DD. The external case EDC may absorb an impact applied externally and may prevent foreign matter/moisture, or the like from being permeated to the display module DM to protect the components accommodated in the external case EDC. Moreover, as an example, the external case EDC may be provided in a type in which receiving members may be combined.

The display device DD according to an embodiment may include an electronic module including various multi-functional modules that may operate the display module DM, a power supply module that may supply power necessary for the entire operation of the display device DD, a bracket coupled with or connected to the display module DM and/or the external case EDC to divide the internal space of the display device DD, and the like within the spirit and the scope of the disclosure.

Figure 3A:
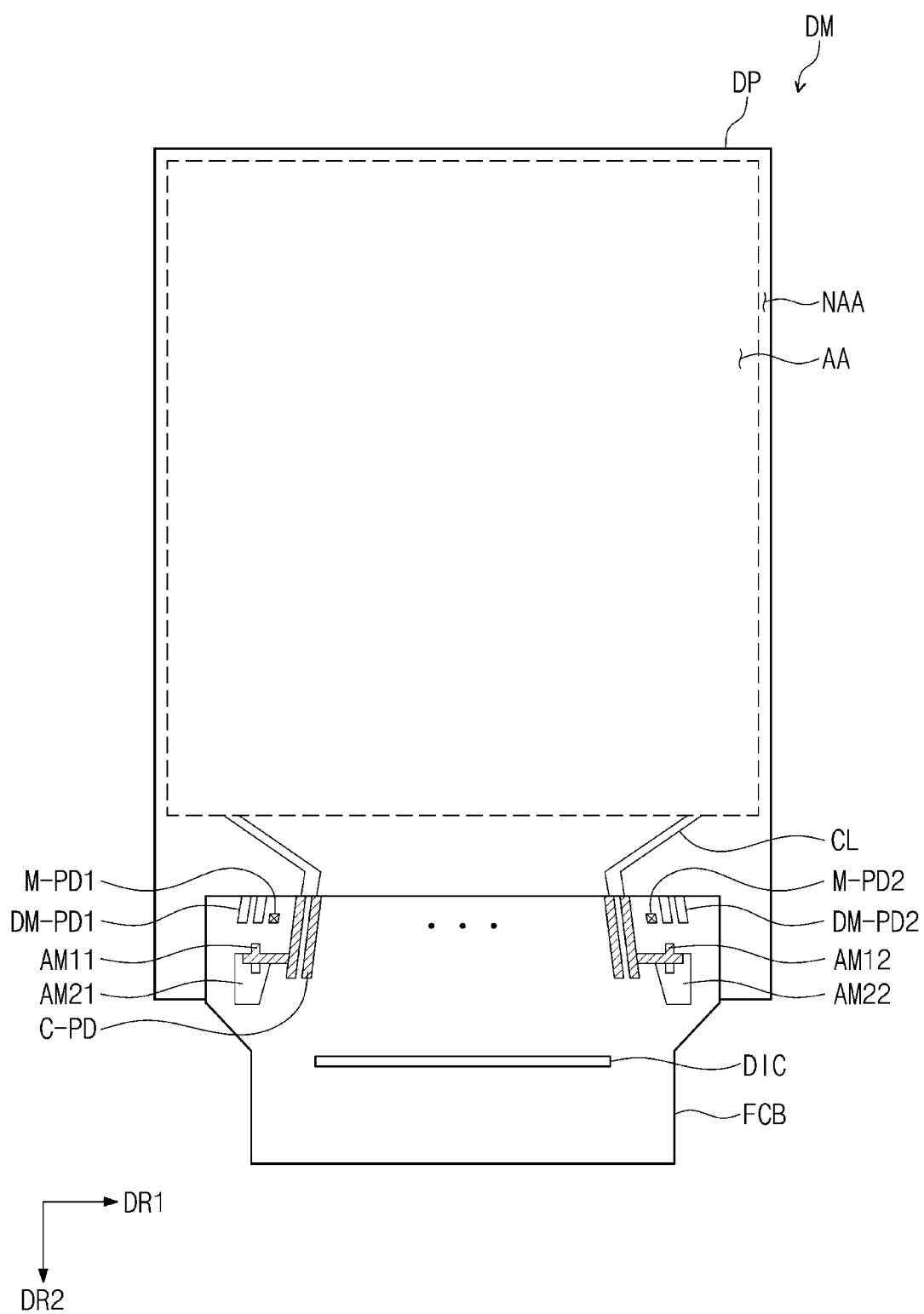
FIG. 3A is a plan view of a display module according to an embodiment.
Figure 3B:
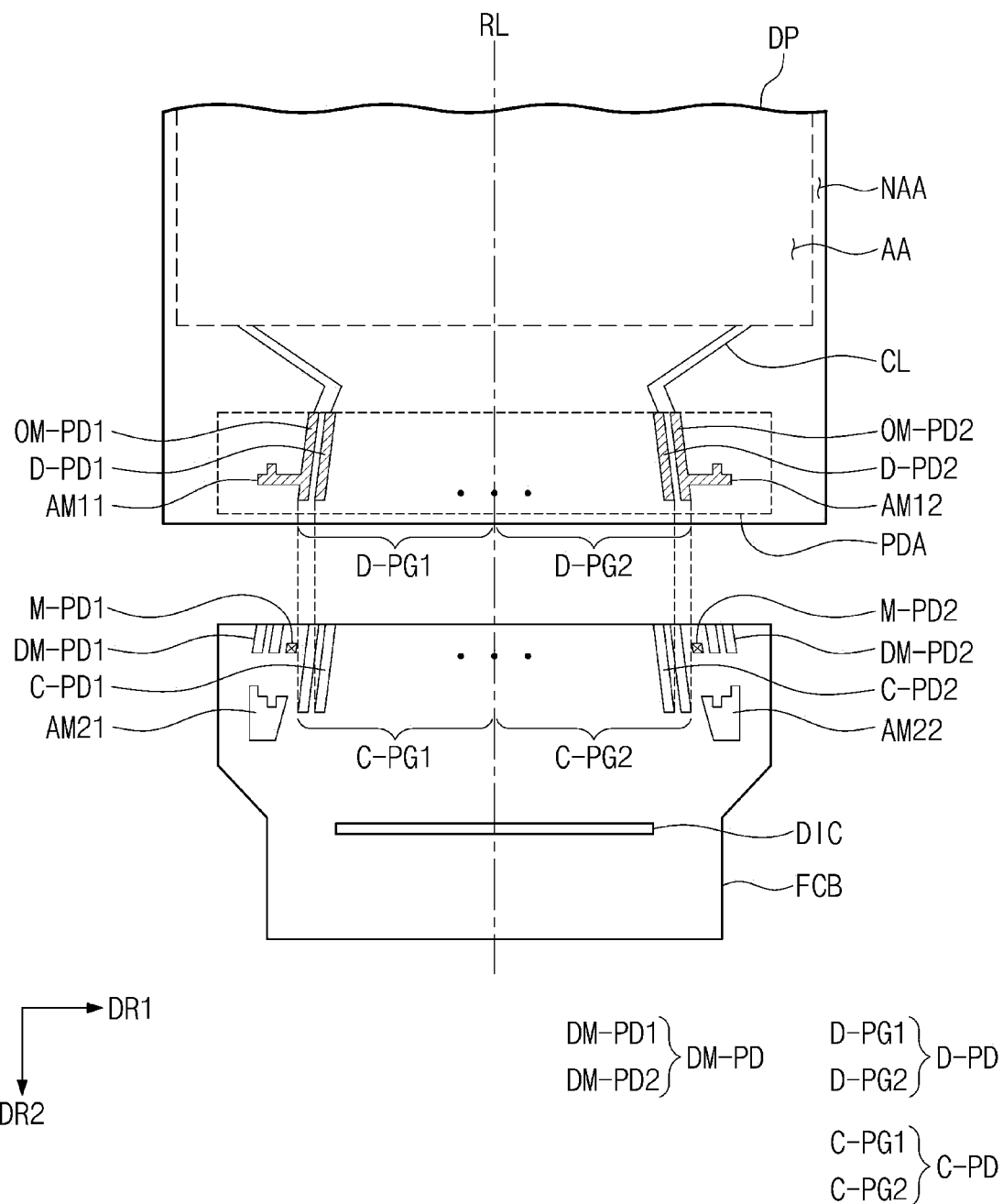
FIG. 3B is an exploded plan view of the display panel and the flexible circuit film illustrated in FIG. 3A.

FIG. 3A is a plan view of a display panel according to an embodiment. FIG. 3B is an exploded plan view of the display panel and the flexible circuit film illustrated in FIG. 3A.

Referring to FIGS. 3A and 3B, the display panel DP may include the active area AA in which an image may be displayed and the non-active area NAA surrounding or adjacent to the active area AA. Pixels may be disposed in the active area AA. The non-active area NAA may include a pad area PDA in which panel pads D-PD (also referred as display pads) may be disposed.

The pad area PDA may be a part electrically connected to the flexible circuit film FCB, and may include the panel pads D-PD that may electrically connect the flexible circuit film FCB to the display panel DP. The panel pads D-PD may be electrically connected to corresponding pixels. Connection lines CL that may electrically connect the pixels with the panel pads D-PD may be disposed in the non-active area NAA.

The active area AA may allow an image to be displayed therein, and may be parallel to a plane defined by a first direction DR1 and a second direction DR2. For example, the display panel DP may provide the image in a third direction DR3 (shown in FIG. 2). For convenience of explanation, a direction in which the image may be provided on the display device DD may be defined as an upper direction, and an opposite direction of the upper direction may be defined as a lower direction.

The pad area PDA may be disposed at least on one side of the active area AA. The pad area PDA may be an area in which the flexible circuit film FCB may be combined to the display panel DP. The display panel DP may be electrically connected to external electronic components such as the flexible circuit film FCB, the main circuit board MCB (shown in FIG. 2), and the like through the panel pads D-PD disposed in the pad area PDA.

The panel pads D-PD in the pad area PDA may be arrayed or disposed in the first direction DR1. The panel pads D-PD may be inclined with respect to a virtual reference line RL that may be parallel to the second direction DR2 vertical to the first direction DR1. The reference line RL may be a virtual central line passing through the center of the pad area PDA. As an example, the panel pads D-PD may include a first pad group D-PG1 and a second pad group D-PG2. The first pad group D-PG1 may be disposed at a first side of the reference line RL, and the second pad group D-PG2 may be disposed at a second side of the reference line RL. In FIG. 3B, the first side may be the left side of the reference line RL, and the second side may be the right side of the reference line RL. For convenience of description, in the description below, the first side will be referred as the left side, and the second side will be referred as the right side. However, the first side and the second side are not limited thereto, and may refer to the upper side and the lower side according to a viewing direction.

The panel pads D-PD1 of the first pad group D-PG1 may be inclined with a first slope with respect to the reference line RL, and the panel pads D-PD2 of the second pad group D-PG2 may be inclined with a second slope with respect to the reference line RL. The first slope may correspond to an angle formed by an extension direction of the panel pads D-PD1 of the first pad group D-PG1 and an extension direction of the reference line RL, and the second slope may correspond to an angle formed by an extension direction of the panel pads D-PD2 of the second pad group D-PG2 and the extension direction of the reference line RL. In the specification, the values of the first and second slopes may be positive values and may correspond to acute angles.

The extension direction of the panel pads D-PD1 of the first pad group D-PG1 and the extension direction of the panel pads D-PD2 of the second pad group D-PG2 may cross or intersect each other. The absolute values of the first and second slopes may be the same or substantially the same, and in this case, the first pad group D-PG1 and the second pad group D-PG2 may be disposed to be symmetric on the basis of the reference line RL.

The display panel DP may include first and second alignment marks AM11 and AM12. In FIG. 3B, a structure is illustrated by way of example in which the first and second alignment marks AM11 and AM12 may be connected to panel pads OM-PD1 and OM-PD2 positioned or disposed outermost among the panel pads D-PD, but an embodiment is not limited thereto. In other words, the first and second alignment marks AM11 and AM12 may be positioned separately from the panel pads D-PD. The first and second alignment marks AM11 and AM12 may align the display panel DP and the flexible circuit film FCB in a bonding process to be described later. As an example, a structure in which two alignment marks AM11 and AM12 may be provided to the display panel DP is described, but the number of alignment marks AM11 and AM12 is not limited thereto.

The panel pads D-PD may be formed to include metals such as copper (Cu), silver (Ag), and gold (Au) or a metal-oxide. For example, the panel pads D-PD may be formed to include at least a transparent metal oxide among Indium Tin Oxide (ITO), Indium Zinc Oxide (IZO), Indium Tin Zinc Oxide (ITZO), Zinc Tin Oxide (ZTO), or Antimony Tin Oxide (ATO).

With reference to FIGS. 3A and 3B, the flexible circuit film FCB may include connection pads C-PD, first and second measurement pads M-PD1 and M-PD2. The connection pads C-PD may be arrayed or disposed in the first direction DR1 and may be inclined with respect to the reference line RL.

The connection pads C-PD may be disposed in correspondence to the panel pads D-PD. The connection pads C-PD may include a first connection pad group C-PG1 and a second connection pad group C-PG2. The connection pads C-PD1 of the first connection pad group C-PG1 may be disposed in correspondence to the panel pads D-PD1 of the first pad group D-PG1, and the connection pads C-PD2 of the second connection pad group C-PG2 may be disposed in correspondence to the panel pads D-PD2 of the second pad group D-PG2.

The first measurement pad M-PD1 may be disposed adjacent to a first side of the connection pads C-PD, and the second measurement pad M-PD2 may be disposed adjacent to a second side of the connection pads C-PD. As an example, the first measurement pad M-PD1 may be disposed adjacent to a connection pad positioned or disposed first on the first direction DR1 among the connection pads C-PD1 of the first connection pad group C-PG1. The second measurement pad M-PD2 may be disposed adjacent to a connection pad positioned or disposed last on the first direction DR1 among the connection pads C-PD2 of the second connection pad group C-PG2. Accordingly, the connection pads C-PD may be disposed between the first and second measurement pads M-PD1 and M-PD2.

Here, the distance between the first and second measurement pads M-PD1 and M-PD2 may be defined as the pitch Pt (see FIG. 4, hereafter, actual pitch) of the flexible circuit film FCB in the first direction DR1. The actual pitch Pt of the flexible circuit film FCB may be a value to be used in the bonding process of the flexible circuit film FCB and the display panel DP, which will be described later.

The flexible circuit film FCB may include dummy pads DM-PD disposed outside of or adjacent to the connection pads C-PD. The dummy pads DM-PD may have a shape inclined with respect to the reference line RL. As an example, the dummy pads DM-PD may include first dummy pads DM-PD1 disposed adjacent to the first measurement pad M-PD1, and second dummy pads DM-PD2 disposed adjacent to the second measurement pad M-PD2. The first dummy pads DM-PD1 may be parallel to the connection pads C-PD1 of the first connection pad group C-PG1, and the second dummy pads DM-PD2 may be parallel to the connection pads C-PD2 of the second connection pad group C-PG2.

The first and second measurement pads M-PD1 and M-PD2 and the connection pads C-PD may be disposed between the first and second dummy pads DM-PD1 and DM-PD2.

The flexible circuit film FCB may include third and fourth alignment marks AM21 and AM22. The third and fourth alignment marks AM21 and AM22 may be provided or disposed at positions corresponding to the first and second alignment marks AM11 and AM12, and may be aligned with the first and second alignment marks AM11 and AM12 in the bonding process of the display panel DP and the flexible circuit film FCB.

Hereinbelow, the bonding process of the display panel DP and the flexible circuit film FCB will be described with reference to FIGS. 4 to 5C.

Figure 4:
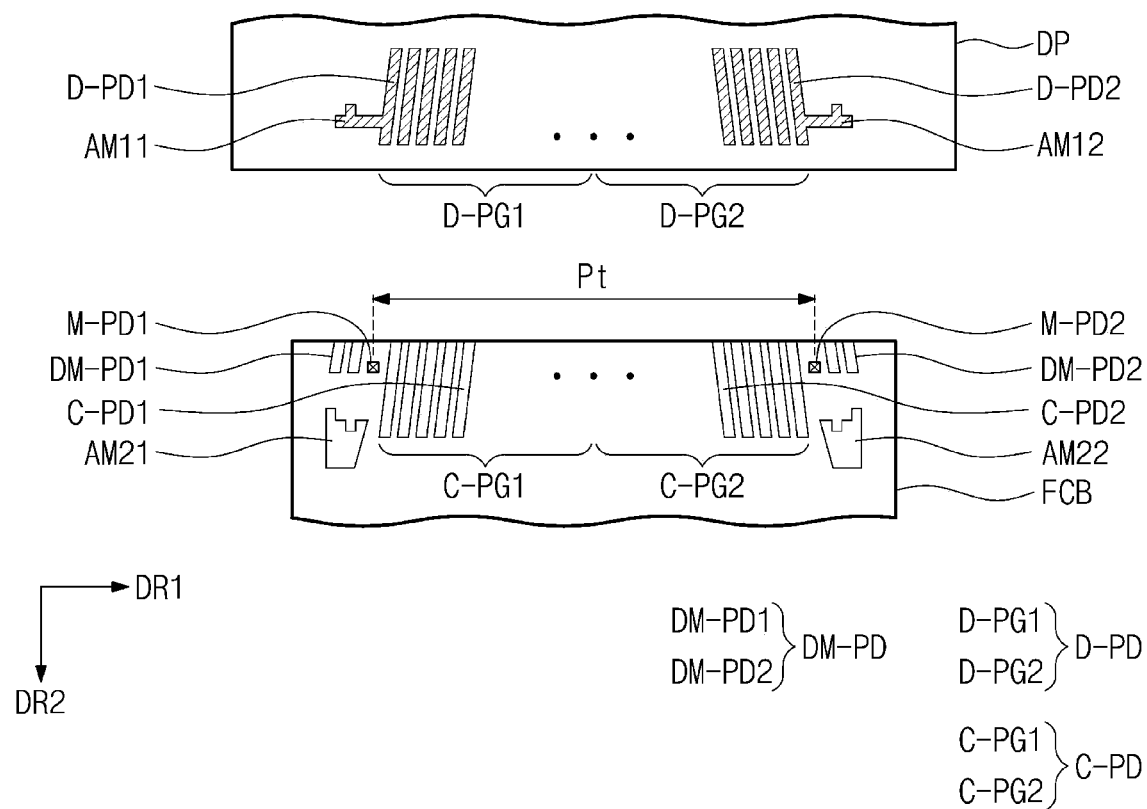
FIG. 4 is an enlarged plan view of panel pads of the display panel and connection pads of the flexible circuit film as illustrated in FIG. 3B.
Figure 5A:
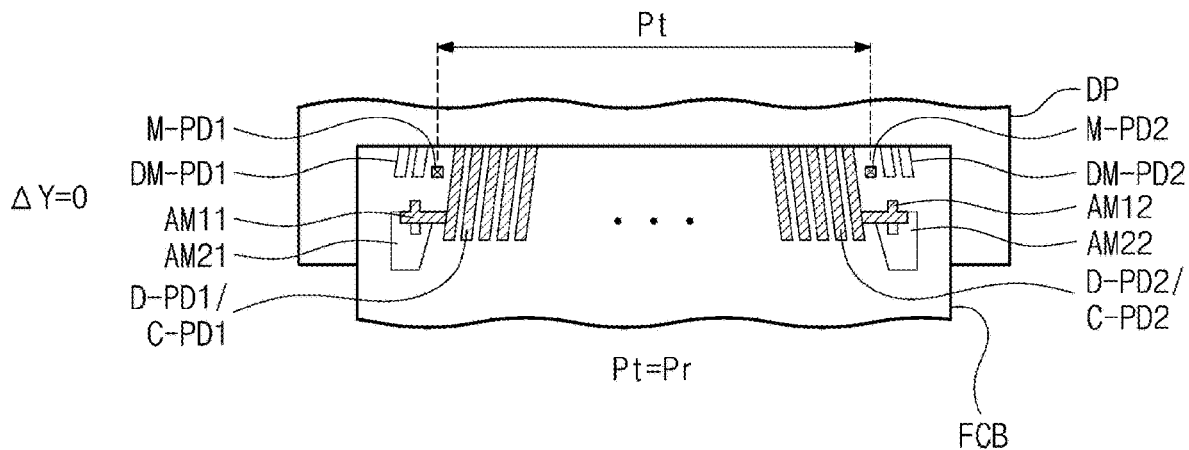
FIG. 5A is a plan view illustrating a combined state of the display panel and the flexible circuit film according to an embodiment.
Figure 5B:
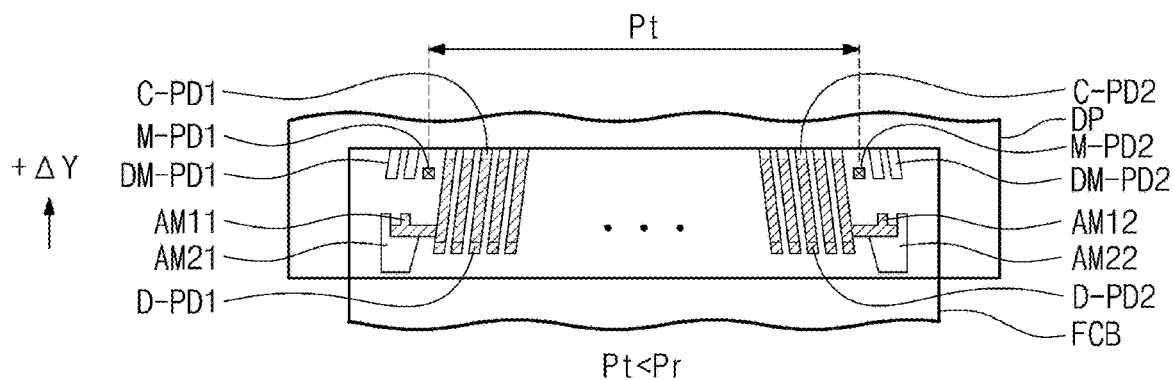
FIG. 5B is a plan view illustrating a combined state of the display panel and the flexible circuit film according to another embodiment.

FIG. 4 is an enlarged plan view of the panel pads of the display panel and the connection pads of the flexible circuit film as illustrated in FIG. 3B. FIG. 5A is a plan view showing a combination state of the display panel and the flexible circuit film according to an embodiment, FIG. 5B is a plan view showing a combination state of the display panel and the flexible circuit film according to another embodiment, and FIG. 5C is a plan view showing a combination state of the display panel and the flexible circuit film according to a further embodiment.

With reference to FIG. 4, for bonding the display panel DP with the flexible circuit film FCB, the panel pads D-PD of the display panel DP and the connection pads C-PD of the flexible circuit film FCB may be aligned primarily. The panel pads D-PD and the connection pads C-PD may be aligned using the first and second alignment marks AM11 and AM12 of the display panel DP, and the third and fourth alignment marks AM21 and AM22 of the flexible circuit film FCB. In other words, displacements between the first and second alignment marks AM11 and AM12 of the display panel DP and the third and fourth alignment marks AM21 and AM22 of the flexible circuit film FCB may be matched in the second direction DR2.

Even though the connection pads C-PD and the panel pads D-PD may be designed to correspond to each other, displacements between the connection pads C-PD and the panel pads D-PD in the first direction DR1 may not be matched. For example, the flexible circuit film FCB may be contracted or expanded in the first direction DR1 due to influences from temperature and humidity in a manufacturing process. The actual pitch Pt of the flexible circuit film FCB may be smaller or greater than a reference pitch Pr (see FIGS. 5A to 5C). Here, the actual pitch Pt may be defined as the distance between the first and second measurement pads M-PD1 and M-PD2.

The sizes of the actual pitch Pt and the reference pitch Pr may be compared, and, according to the comparison result, a correction value ΔY (hereinbelow, Y-axis correction value) in the second direction DR2 of the flexible circuit film FCB may be calculated.

As shown in FIG. 5A, in a case that the sizes of the actual pitch Pt and the reference pitch Pr may be the same, the Y-axis correction value ΔY may be substantially 0. In other words, the display panel DP and the flexible circuit film FCB may be bonded at a preset Y-axis position.

However, in a case that the actual pitch Pt may be smaller than the reference pitch Pr as shown in FIG. 5B, the Y-axis correction value ΔY may have a positive value. In other words, the flexible circuit film FCB may be moved inside the display panel DP (for example, in a direction close to the active area AA (see FIG. 3A) of the display panel DP) along the second direction DR2. Accordingly, in the manufacturing process, in a case that the actual pitch Pt may be smaller than the reference pitch Pr due to contraction of the flexible circuit film FCB, the connection pads C-PD may be correspondingly combined with the panel pads D-PD. The Y-axis correction value ΔY may be set to a point at which the connection pads C-PD may maximally overlap the corresponding panel pads D-PD.

Figure 5C:
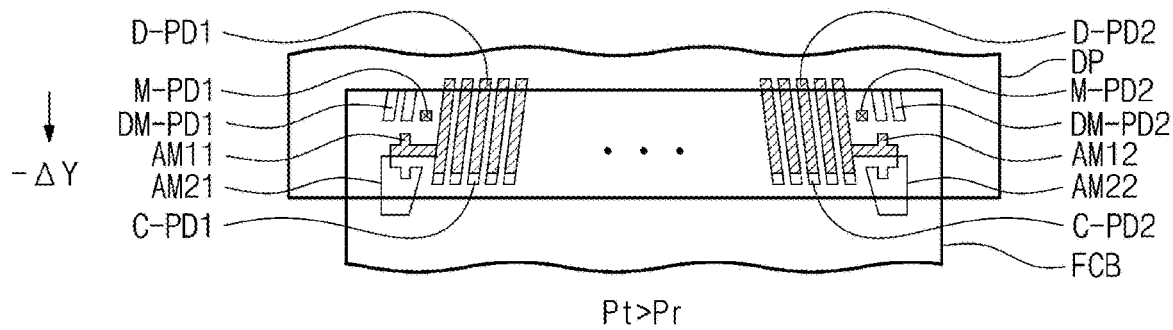
FIG. 5C is a plan view illustrating a combined state of the display panel and the flexible circuit film according to a further embodiment.

As in FIG. 5C, in a case that the actual pitch Pt may be greater than the reference pitch Pr, the Y-axis correction value ΔY may have a negative value. In other words, the flexible circuit film FCB may be moved outside of the display panel DP (for example, in a direction away from the active area AA of the display panel DP) along the second direction DR2. Accordingly, in the manufacturing process, even in a case that the actual pitch Pt may be greater than the reference pitch Pr due to expansion of the flexible circuit film FCB, the connection pads C-PD may be correspondingly combined with the panel pads D-PD. The Y-axis correction value ΔY may be set to a point at which the connection pads C-PD may maximally overlap the corresponding panel pads D-PD.

Here, the Y-axis correction value ΔY may be determined according to a difference value between the actual pitch Pt and the reference pitch Pr. In a case that the actual pitch Pt may not be accurately measured, the Y-axis correction value ΔY may not be correct, and thus, misalignment may occur between the flexible circuit film FCB and the display panel DP.

According to the disclosure, the actual pitch Pt may be defined as an interval between the first and second measurement pads M-PD1 and M-PD2. The measurement pads M-PD1 and M-PD2 that may measure the actual pitch Pt may be provided or disposed on the flexible circuit film FCB, and thus, the actual pitch Pt of the flexible circuit film FCB may be accurately measured. As a result, the misalignment between the flexible circuit film FCB and the display panel DP may be prevented.

Figure 6:
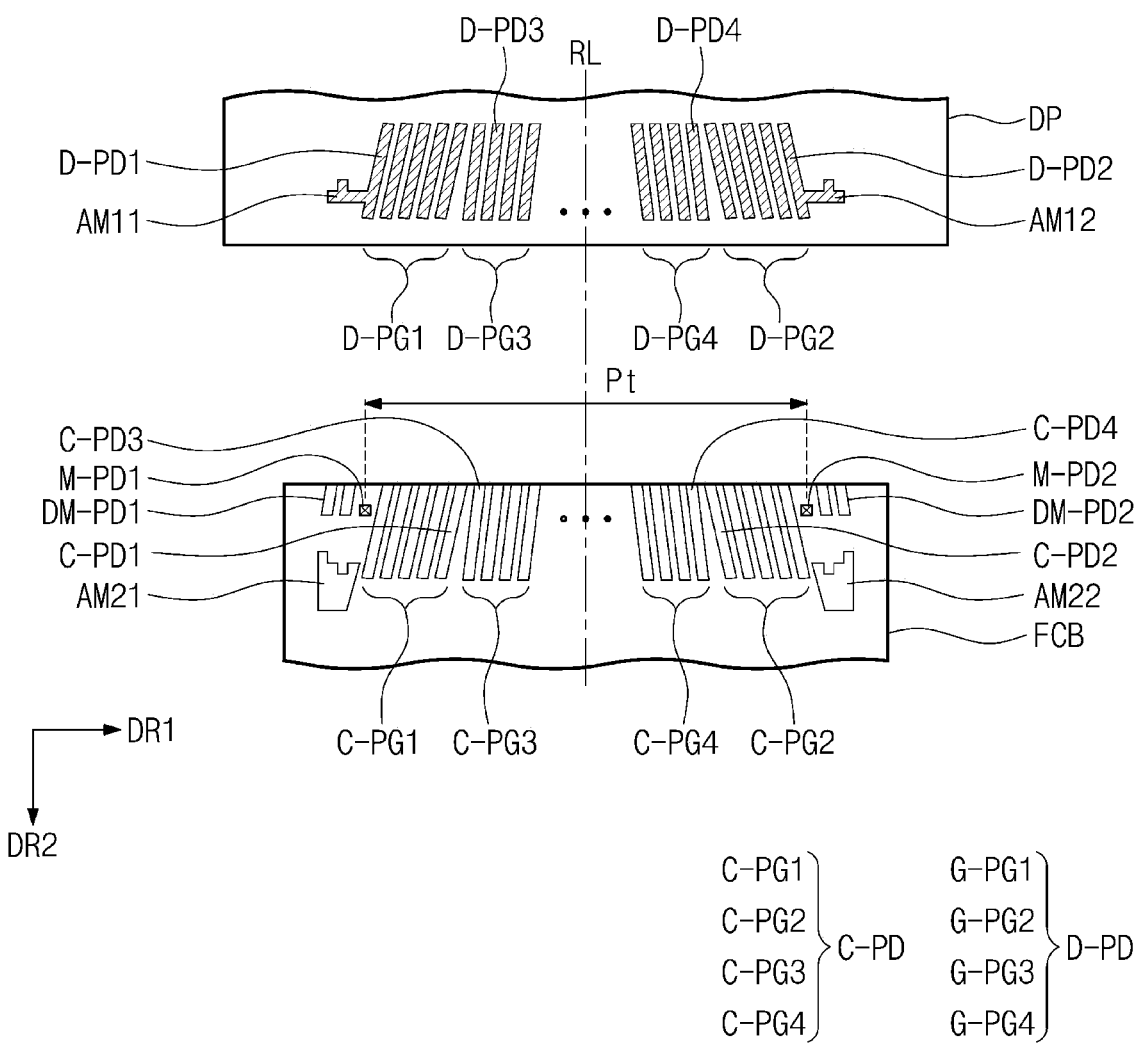
FIG. 6 is an enlarged plan view of panel pads of the display panel and connection pads of the flexible circuit film according to an embodiment.

FIG. 6 is an enlarged plan view of the panel pads of the display panel and the connection pads of the flexible circuit film according to an embodiment.

Referring to FIG. 6, the panel pads D-PD of the display panel DP according to an embodiment may be inclined with respect to the virtual reference line RL that may be parallel to the second direction DR2 vertical to the first direction DR1.

As an example, the panel pads D-PD may include a first pad group D-PG1, a second pad group D-PG2, a third pad group D-PG3, and a fourth pad group D-PG4. The first and third pad groups D-PG1 and D-PG3 may be disposed on a first side of the reference line RL, and the second and fourth pad group D-PG2 and D-PG4 may be disposed on a second side of the reference line RL. In FIG. 6, the first side may be defined as the left side of the reference line RL, and the second side may be defined as the right side of the reference line RL.

The panel pads D-PD1 of the first pad group D-PG1 may be inclined with a first slope with respect to the reference line RL, and the panel pads D-PD3 of the third pad group D-PG3 may be inclined with a third slope with respect to the reference line RL. The first slope may correspond to an angle formed by an extension direction of the panel pads D-PD1 of the first pad group D-PG1 and an extension direction of the reference line RL, and the third slope may correspond to an angle formed by an extension direction of the panel pads D-PD3 of the third pad group D-PG3 and the extension direction of the reference line RL. The magnitude of the first slope may be different from that of the third slope. For example, in a case that the separation distance between the first pad group D-PG1 and the reference line RL is greater than that between the third pad group D-PG3 and the reference line RL, the first slope may be greater than the third slope. In other words, the panel pads D-PD3 of the third pad group D-PG3 may have a more inclined shape than the panel pads D-PD1 of the first pad group D-PG1 with respect to the horizontal line (i.e., the line parallel to the first direction DR1) the perpendicular to the reference line RL.

The panel pads D-PD2 of the second pad group D-PG2 may be inclined with a second slope with respect to the reference line RL, and the panel pads D-PD4 of the fourth pad group D-PG4 may be inclined with a fourth slope with respect to the reference line RL. The second slope may correspond to an angle formed by an extension direction of the panel pads D-PD2 of the second pad group D-PG2 and an extension direction of the reference line RL, and the fourth slope may correspond to an angle formed by an extension direction of the panel pads D-PD4 of the fourth pad group D-PG4 and the extension direction of the reference line RL. The magnitude of the second slope may be different from that of the fourth slope. For example, in a case that the separation distance between the second pad group D-PG2 and the reference line RL is greater than that between the fourth pad group D-PG4 and the reference line RL, the second slope may be greater than the fourth slope. In other words, the panel pads D-PD4 of the fourth pad group D-PG4 may have a more inclined shape than the panel pads D-PD2 of the second pad group D-PG2 with respect to the horizontal line (i.e., the line parallel to the first direction DR1) the perpendicular to the reference line RL.

According to an embodiment, the flexible circuit film FCB may include the connection pads C-PD, and the first and second measurement pads M-PD1 and M-PD2.

The connection pads C-PD may be disposed in correspondence to the panel pads D-PD. The connection pads C-PD may include a first connection pad group C-PG1, a second connection pad group C-PG2, a third connection pad group C-PG3, and a fourth connection pad group C-PG4. The third connection pad group C-PG3 may be disposed between the reference line RL and the first connection pad group C-PG1, and the fourth connection pad group C-PG4 may be disposed between the reference line RL and the second connection pad group C-PG2.

The connection pads C-PD1 of the first connection pad group C-PG1 may be disposed in correspondence to the panel pads D-PD1 of the first pad group D-PG1, and the connection pads C-PD2 of the second connection pad group C-PG2 may be disposed in correspondence to the panel pads D-PD2 of the second pad group D-PG2. The connection pads C-PD3 of the third connection pad group C-PG3 may be disposed in correspondence to the panel pads D-PD3 of the third pad group D-PG3, and the connection pads C-PD4 of the fourth connection pad group C-PG4 may be disposed in correspondence to the panel pads D-PD4 of the fourth pad group D-PG4.

The first measurement pad M-PD1 may be disposed adjacent to a first side of the connection pads C-PD, and the second measurement pad M-PD2 may be disposed adjacent to a second side of the connection pads C-PD. As an example, the first measurement pad M-PD1 may be disposed adjacent to a connection pad positioned or disposed first in the first direction DR1 among the connection pads C-PD1 of the first connection pad group C-PG1. The second measurement pad M-PD2 may be disposed adjacent to a connection pad positioned or disposed last in the first direction DR1 among the connection pads C-PD2 of the second connection pad group C-PG2. Accordingly, the connection pads C-PD may be disposed between the first and second measurement pads M-PD1 and M-PD2.

Here, the distance between the first and second measurement pads M-PD1 and M-PD2 may be defined as the pitch Pt (hereinafter, actual pitch) of the flexible circuit film FCB in the first direction DR1. A process in which the actual pitch Pt of the flexible circuit film FCB may be used in the bonding process of the flexible circuit film FCB and the display panel DP has been described with respect to FIG. 4 to FIG. 5C, and thus, it will be omitted to avoid duplication.

In FIG. 6, a structure in which two connection pad groups having different slopes may be respectively disposed at the first and second sides of the reference line RL is illustrated, but the embodiment is not limited thereto. In other words, three or more connection pad groups having different slopes may be disposed at the first side of the reference line RL, and three or more connection pad groups having different slopes may be disposed at the second side of the reference line RL.

Figure 7A:
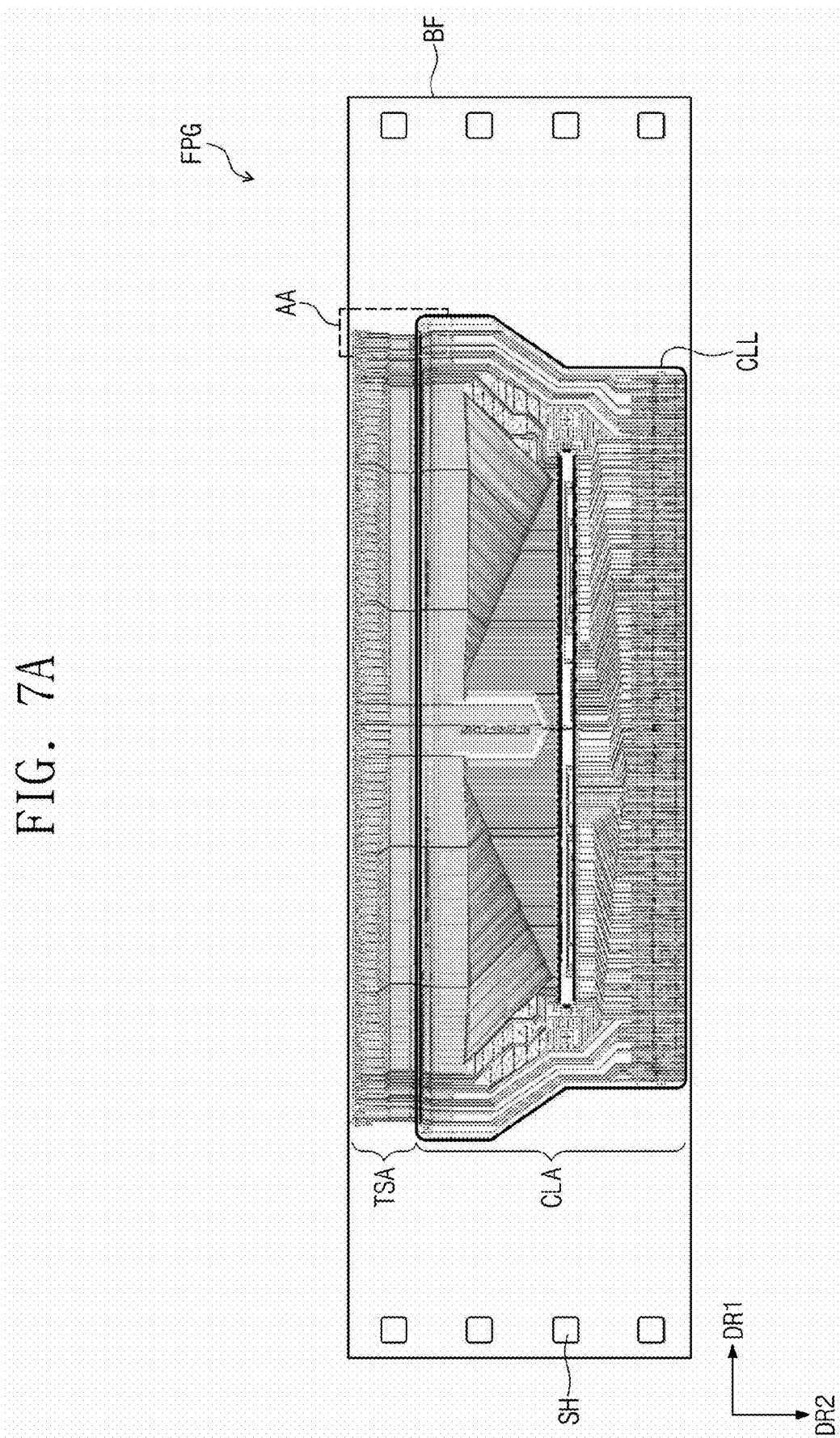
FIG. 7A is a plan view of a film package according to an embodiment.
Figure 7B:
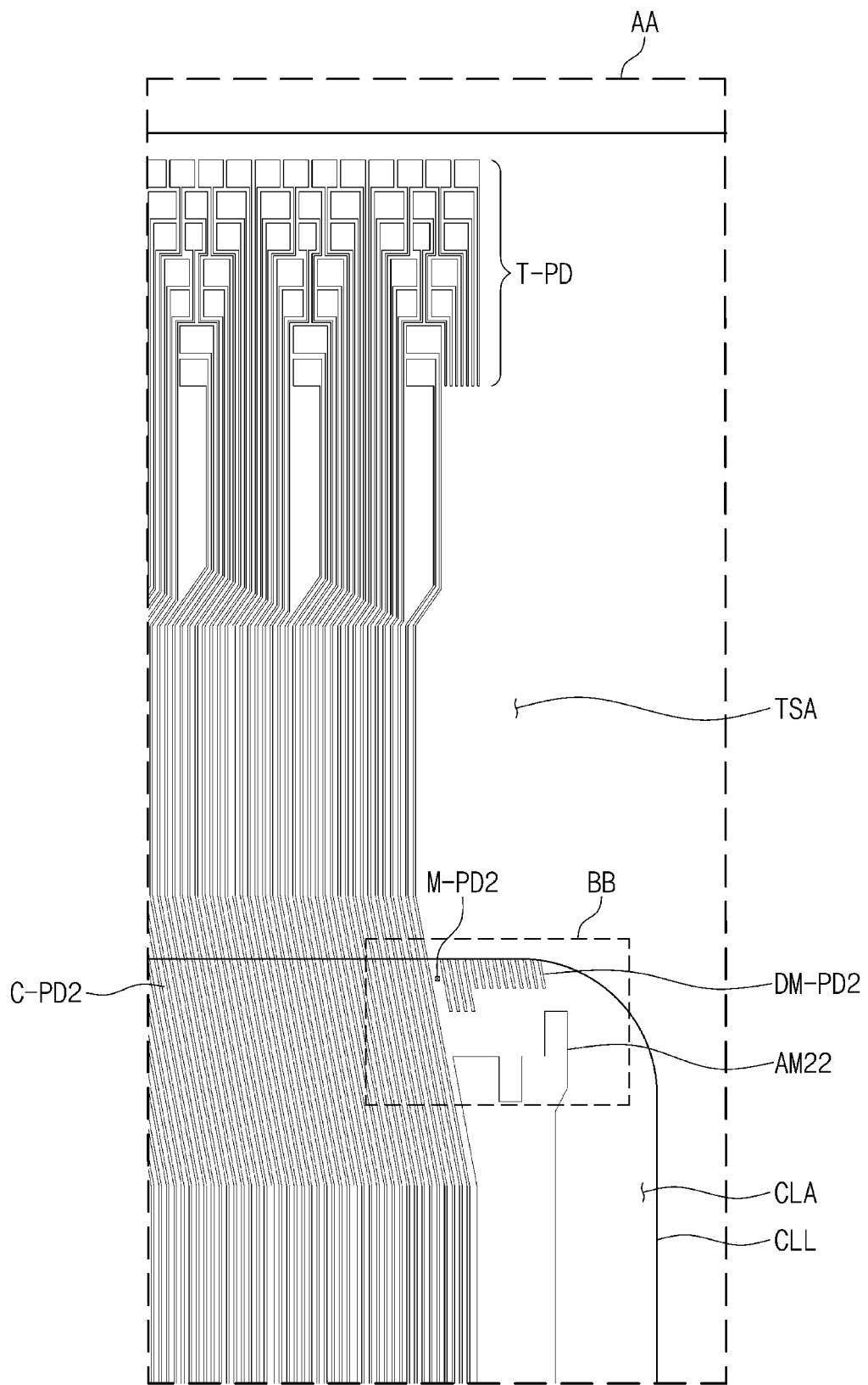
FIG. 7B is an enlarged plan view in which part AA of FIG. 7A is enlarged.
Figure 7C:
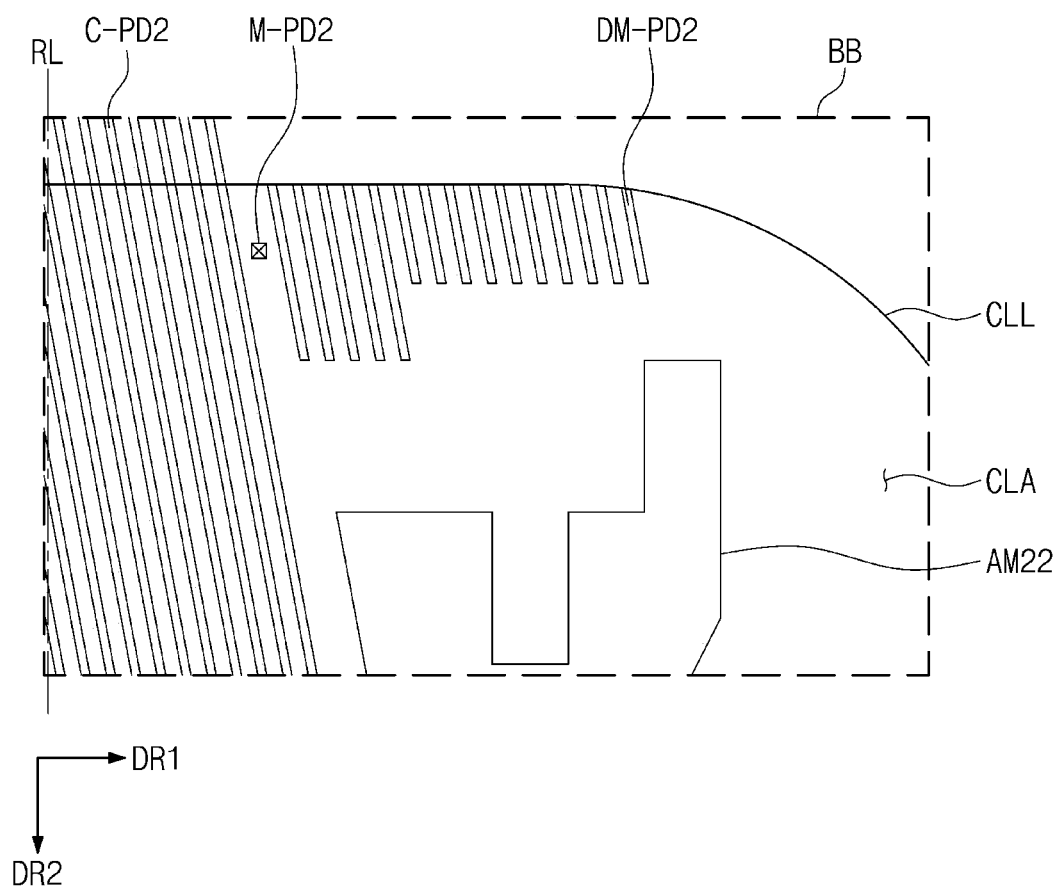
FIG. 7C is an enlarged plan view in which part BB of FIG. 7A is enlarged.

FIG. 7A is a plan view showing a film package according to an embodiment, FIG. 7B is an enlarged plan view in which part AA of FIG. 7A is enlarged, and FIG. 7C is an enlarged plan view in which part BB of FIG. 7B is enlarged.

With reference to FIGS. 4, 7A to 7C, the film package FPG according to an embodiment may include a base film BF, connection pads C-PD, test pads T-PD, and first and second measurement pads M-PD1 and M-PD2.

The base film BF may include a polymer material, for example, polyimide, polyester, or the like within the spirit and the scope of the disclosure. The base film BF may be flexible. In a case that the base film BF is viewed in a plan view, sprocket holes SH may be arrayed or disposed along the second direction DR2 in the edge of the base film BF.

The base film BF may include first and second areas. A cutting line CLL may be provided between the first and second areas to define the first area. The cutting line CLL may be a virtual line. Although FIG. 7A shows only one first area, first areas may be provided in plural to the film package FPG and the first areas may be arrayed or disposed along the second direction DR2. The first area may be an area cut along the cutting line CLL and used as the flexible circuit film (e.g., "FCB" in FIG. 4). Hereinafter, the first area may be referred to as a cutting area CLA.

The second area may include a test area TSA. The test area TSA may be disposed adjacent to the cutting area CLA in the second direction DR2.

Connection pads C-PD may be disposed on the cutting area CLA of the base film BF. The connection pads C-PD may be arrayed or disposed in the first direction DR1 and may extend in a direction crossing or intersecting the first direction DR1. For example, the connection pads C-PD may be inclined with respect to a virtual reference line RL extending in the second direction DR2 vertical to the first direction DR1.

Test pads T-PD may be disposed on the test area TSA of the base film BF. The test pads T-PD may be respectively electrically connected to the connection pads C-PD. For example, the test pads T-PD may be electrically connected to the corresponding respective connection pads C-PD through extension lines extending from one end or ends of the connection pads C-PD.

The first and second measurement pads M-PD1 and M-PD2 may be disposed on the cutting area CLA of the base film BF. The first measurement pad M-PD1 may be disposed adjacent to a connection pad positioned or disposed first in the first direction DR1 among the connection pads C-PD. The second measurement pad M-PD2 may be disposed adjacent to a connection pad positioned or disposed last in the first direction DR1 among the connection pads C-PD.

Accordingly, the connection pads C-PD may be disposed between the first and second measurement pads M-PD1 and M-PD2.

Here, the distance between the first and second measurement pads M-PD1 and M-PD2 may be measured to obtain the pitch Pt (hereafter, the actual pitch) of the flexible circuit film FCB in the first direction DR1. The actual pitch Pt of the flexible circuit film FCB may be used in the bonding process of the flexible circuit film FCB and the display panel DP.

The film package FPG may include first and second dummy pads DM-PD1 and DM-PD2 disposed outside of or adjacent to the connection pads C-PD. The first dummy pads DM-PD1 may be disposed adjacent to the first measurement pad M-PD1, and the second dummy pads DM-PD2 may be disposed adjacent to the second measurement pad M-PD2. For convenience of the explanation, FIGS. 7B and 7C illustrate only the second measurement pads M-PD2 and the second dummy pads DM-PD2, but the first measurement pads M-PD1 and the first dummy pads DM-PD1 may have similar structures.

The second dummy pads DM-PD2 may extend in parallel to the connection pads C-PD2 of the second connection pad group C-PG2. In other words, the second dummy pads DM-PD2 may have the shapes inclined with respect to the reference line RL.

The second measurement pads M-PD2 may be disposed between the second dummy pads DM-PD2 and the connection pads C-PD2 of the second connection pad group C-PG2. However, the position of the second measurement pad M-PD2 is not limited thereto.

Hereinafter, other embodiments of the first and second measurement pads M-PD1 and M-PD2 will be described in detail.

Figure 8A:
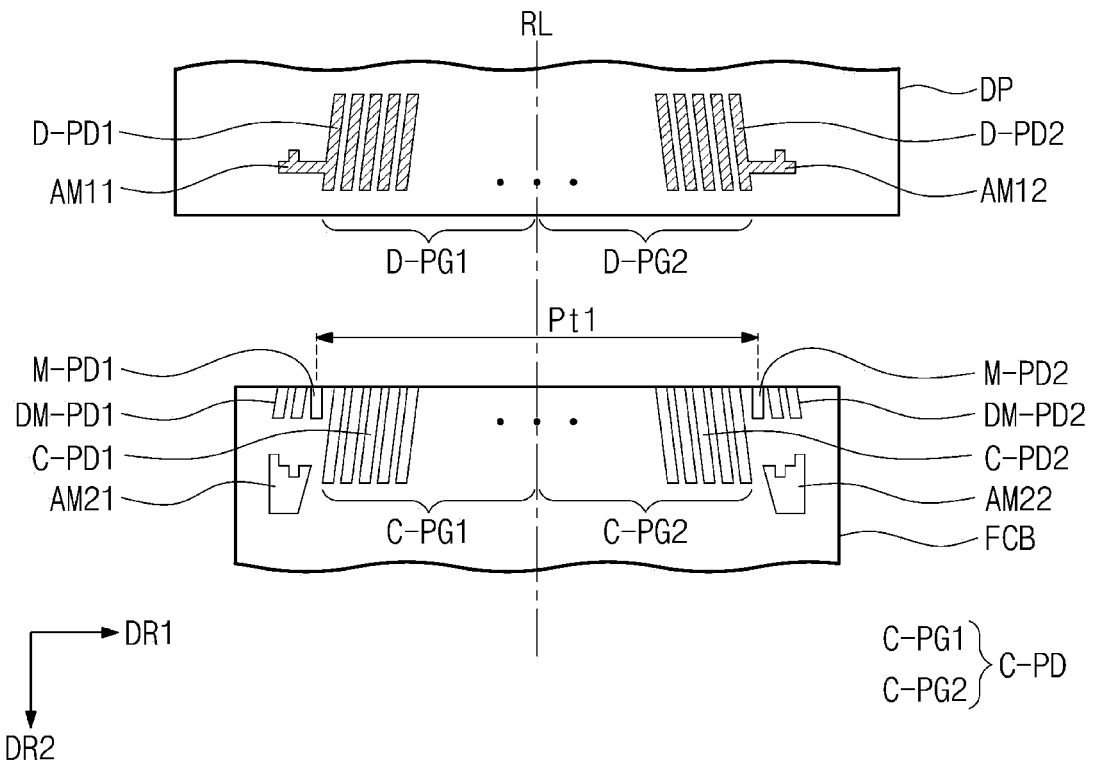
FIG. 8A is an enlarged plan view of panel pads of the display panel and connection pads of the flexible circuit film according to an embodiment.
Figure 8B:
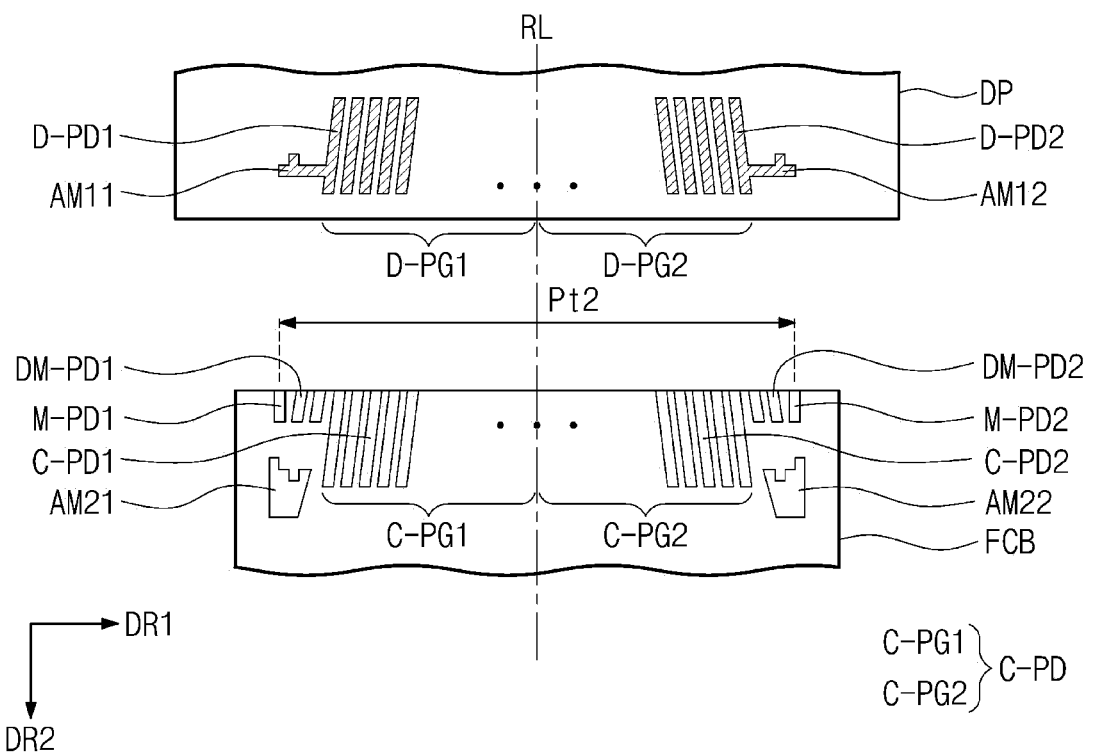
FIG. 8B is an enlarged plan view of panel pads of the display panel and connection pads of the flexible circuit film according to an embodiment.

FIG. 8A is an enlarged plan view of the panel pads of the display panel and the connection pads of the flexible circuit film according to an embodiment, and FIG. 8B is an enlarged plan view of the panel pads of the display panel and the connection pads of the flexible circuit film according to an embodiment. Among the elements illustrated in FIGS. 8A and 8B, the same elements as those illustrated in FIGS. 3A to 5C are denoted by the same reference numerals and detailed descriptions thereabout will be omitted.

With reference to FIG. 8A, according to an embodiment, the flexible circuit film FCB may include connection pads C-PD, first dummy pads DM-PD1, second dummy pads DM-PD2, and first and second measurement pads M-PD1 and M-PD2.

The connection pads C-PD may be disposed between the first and second measurement pads M-PD1 and M-PD2. The first dummy pads DM-PD1 may be disposed adjacent to a first connection pad in the first direction DR1 among the connection pads C-PD, and the second dummy pads DM-PD2 may be disposed adjacent to a last connection pad in the first direction DR1 among the connection pads C-PD.

The connection pads C-PD may have the shape inclined with respect to the reference line RL. The connection pads C-PD may be divided into a first connection pad group C-PG1 including connection pads C-PD1 having a first slope with respect to the reference line RL, and a second connection pad group C-PG2 including connection pads C-PD2 having a second slope with respect to the reference line RL.

The first dummy pads DM-PD1 may have the shape substantially parallel to or inclined with respect to the reference line RL. In other words, FIG. 8A illustrates the structure in which the first dummy pads DM-PD1 may be inclined with the first slope with respect to the reference line RL, but the structure is not limited thereto. The first dummy pads DM-PD1 may be disposed substantially parallel to the reference line RL.

The first measurement pads M-PD1 may be disposed between the first dummy pads DM-PD1 and the first connection pad group C-PG1. The first measurement pads M-PD1 may be disposed substantially parallel with respect to the reference line RL. The first measurement pads M-PD1 may have a substantially rectangular shape extending long in the second direction DR2.

The second dummy pads DM-PD2 may be substantially parallel to or inclined with respect to the reference line RL. In other words, FIG. 8A illustrates the structure in which the second dummy pads DM-PD2 may be inclined with the second slope with respect to the reference line RL, but the structure is not limited thereto. The second dummy pads DM-PD2 may be disposed substantially parallel to the reference line RL.

The second measurement pads M-PD2 may be disposed between the second dummy pads DM-PD2 and the second connection pad group C-PG2. The second measurement pads M-PD2 may be disposed substantially parallel with respect to the reference line RL. The second measurement pads M-PD2 may have a substantially rectangular shape extending long in the second direction DR2.

Here, the distance between the first and second measurement pads M-PD1 and M-PD2 may be defined as an actual pitch Pt1 of the flexible circuit film FCB.

With reference to FIG. 8B, the first measurement pad M-PD1 may be disposed outer than the first dummy pads DM-PD1. The first measurement pads M-PD1 may be disposed substantially parallel with respect to the reference line RL. The first measurement pads M-PD1 may have a substantially rectangular shape extending long in the second direction DR2.

The second measurement pad M-PD2 may be disposed outer than the second dummy pads DM-PD2. The second measurement pads M-PD2 may be disposed substantially parallel with respect to the reference line RL. The second measurement pads M-PD2 may have a substantially rectangular shape extending long in the second direction DR2.

The positions of the first and second measurement pads M-PD1 and M-PD2 may not be limited to those shown in FIGS. 8A and 8B. For example, the first measurement pad M-PD1 may be positioned or disposed between the first dummy pads DM-PD1, and the second measurement pad M-PD2 may be positioned or disposed between the second dummy pads DM-PD2.

Here, the distance between the first and second measurement pads M-PD1 and M-PD2 may be defined as an actual pitch Pt2 of the flexible circuit film FCB. In a case that the first and second measurement pads M-PD1 and M-PD2 may be disposed outer than the dummy pads DM-PD1 and DM-PD2, the actual pitch Pt2 of FIG. 8B may be greater than that actual pitch Pt1 of FIG. 8A.

Figure 9A:
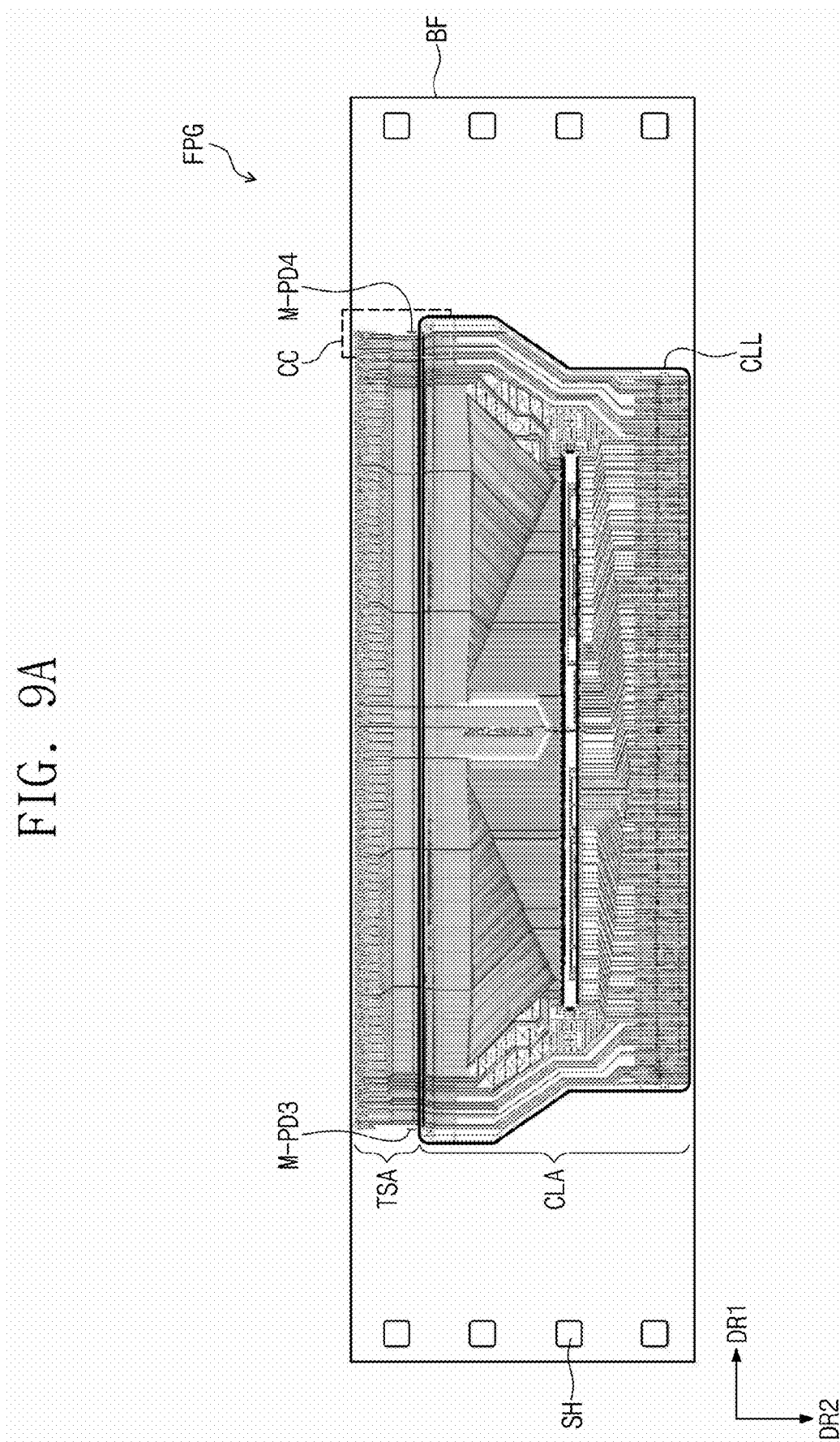
FIG. 9A is a plan view of a film package according to an embodiment.
Figure 9B:
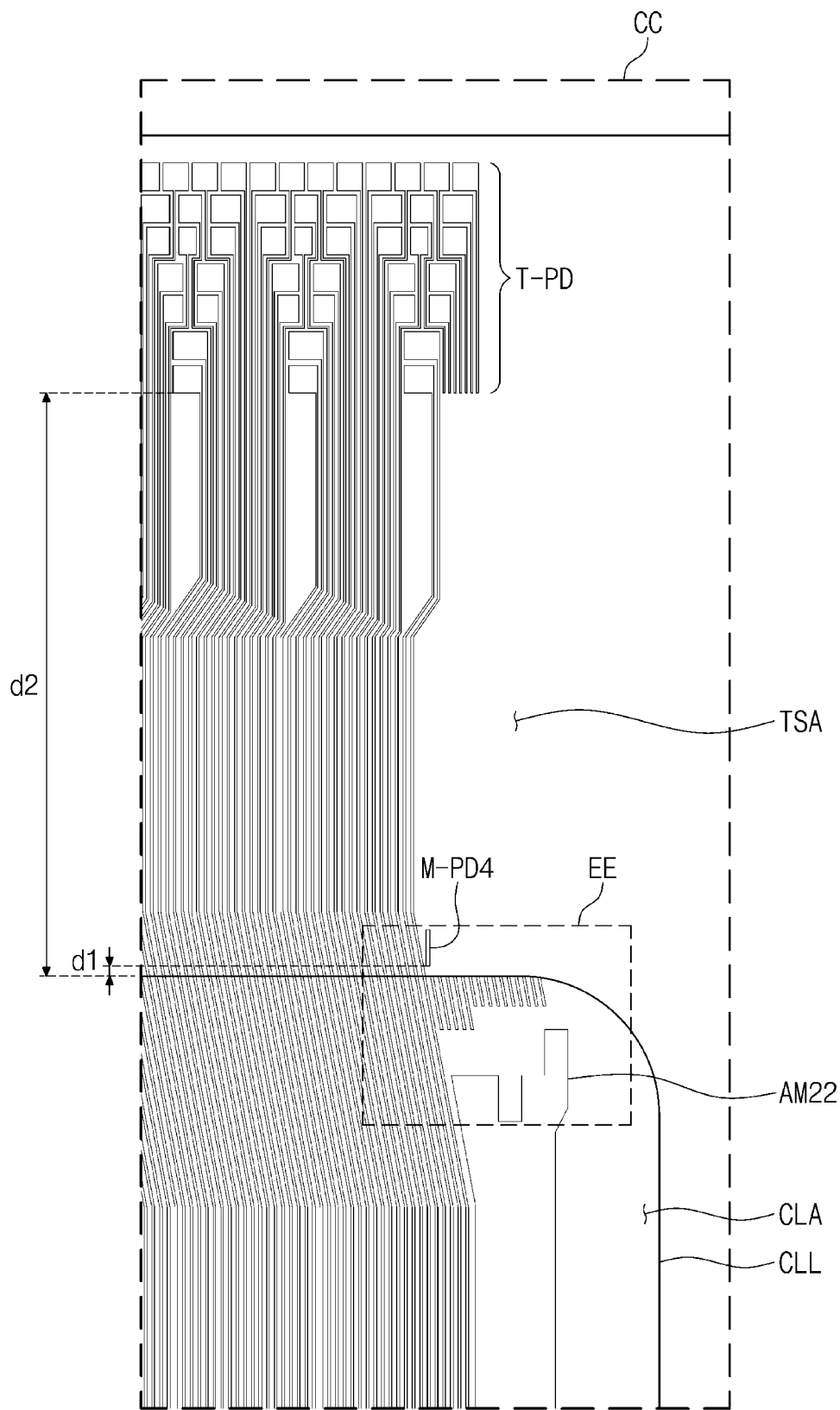
FIG. 9B is an enlarged plan view in which part CC of FIG. 9A is enlarged.
Figure 9C:
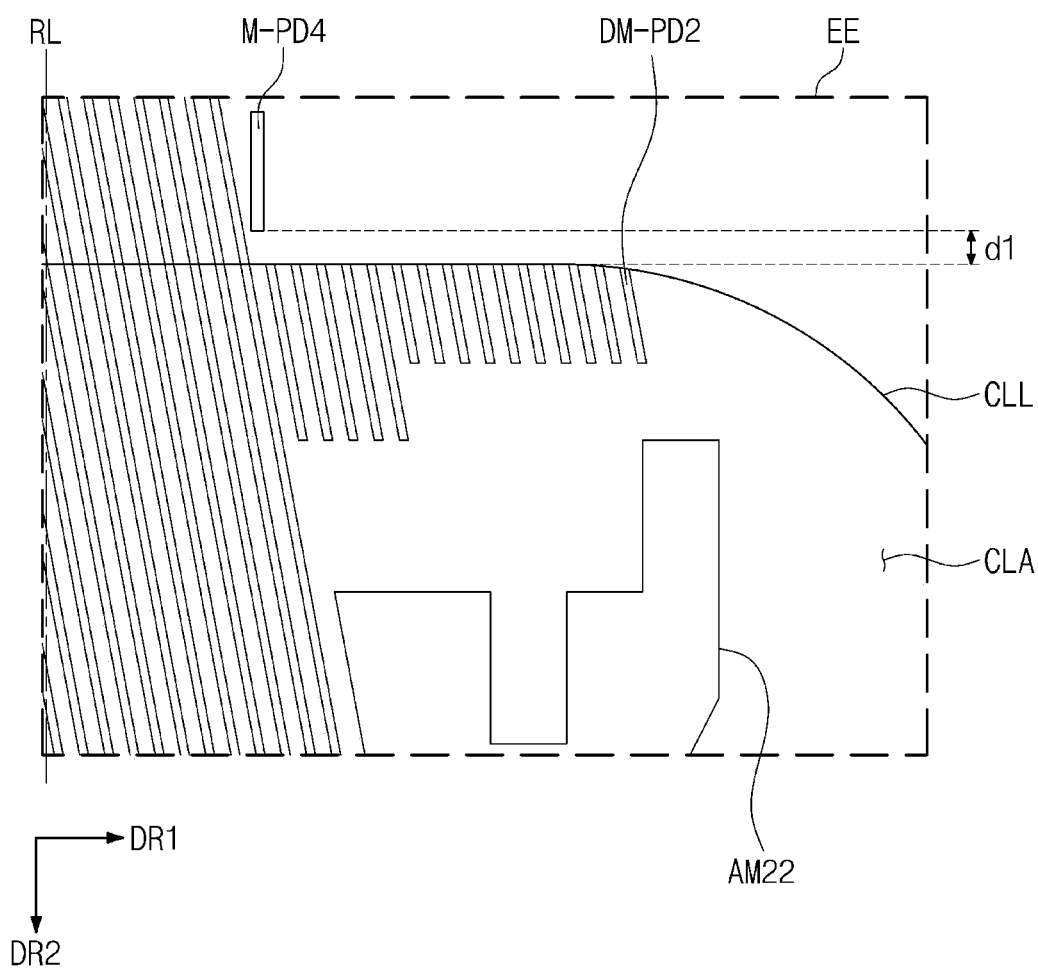
FIG. 9C is an enlarged plan view in which part EE of FIG. 9B is enlarged.

FIG. 9A is a plan view of a film package according to an embodiment, FIG. 9B is an enlarged plan view in which part CC of FIG. 9A is enlarged, FIG. 9C is an enlarged plan view in which part EE of FIG. 9B is enlarged. Among the elements illustrated in FIGS. 9A to 9C, the same elements as those illustrated in FIGS. 7A to 7C are denoted by the same reference numerals and detailed descriptions thereabout will be omitted.

With reference to FIGS. 9A to 9C, the film package FPG according to an embodiment may include a base film BF, connection pads C-PD (refer to FIG. 4), test pads T-PD, and first and second measurement pads M-PD3 and M-PD4.

However, the disclosure is not limited thereto and the first and second measurement pads may include other reference characters within the spirit and the scope of the disclosure.

The connection pads C-PD may be disposed on the cutting area CLA of the base film BF. The connection pads C-PD may be arrayed or disposed in the first direction DR1 and may extend in a direction crossing or intersecting the first direction DR1. For example, the connection pads C-PD may be inclined with respect to a virtual reference line RL extending in the second direction DR2 vertical to the first direction DR1.

The test pads T-PD may be disposed on the test area TSA of the base film BF. The test pads T-PD may be respectively electrically connected to the connection pads C-PD. For example, the test pads T-PD may be electrically connected to the corresponding respective connection pads C-PD through extension lines extending from one end or ends of the connection pads C-PD.

The first and second measurement pads M-PD3 and M-PD4 may be disposed on the test area TSA of the base film BF. For example, the first and second measurement pads M-PD3 and M-PD4 may be disposed between the test pads T-PD and the connection pads C-PD. The first and second measurement pads M-PD3 and M-PD4 may be disposed more adjacent to the connection pads C-PD than to the test pad T-PD.

An interval between the first and second measurement pads M-PD3 and M-PD4 and the connection pads C-PD may be defined as a first interval d1, and an interval between the test pads T-PD and the connection pads C-PD may be defined as a second interval d2. The first interval d1 may be defined as an interval between the first and second measurement pads M-PD3 and M-PD4, and the cutting line CLL. The first interval d1 may be smaller than the second interval d2. Here, the second interval d2 may be defined as the shortest distance between the test pads T-PD and the connection pads C-PD. As an example, the first interval d1 may have a value greater than about 0 μm and smaller than about 500 μm.

In order to accurately measure the actual pitch of the flexible circuit film FCB (see FIG. 2), the first and second measurement pads M-PD3 and M-PD4 may be disposed closest to the cutting line CLL.

As illustrated in FIGS. 9A to 9C, the first and second measurement pads M-PD3 and M-PD4 may have substantially rectangular shapes extending long in the second direction DR2. However, the shapes of the first and second measurement pads M-PD3 and M-PD4 are not limited thereto. The first and second measurement pads M-PD3 and M-PD4 may have substantially square shapes, and have greater widths than the connection pads C-PD in the first direction DR1.

Figure 10:
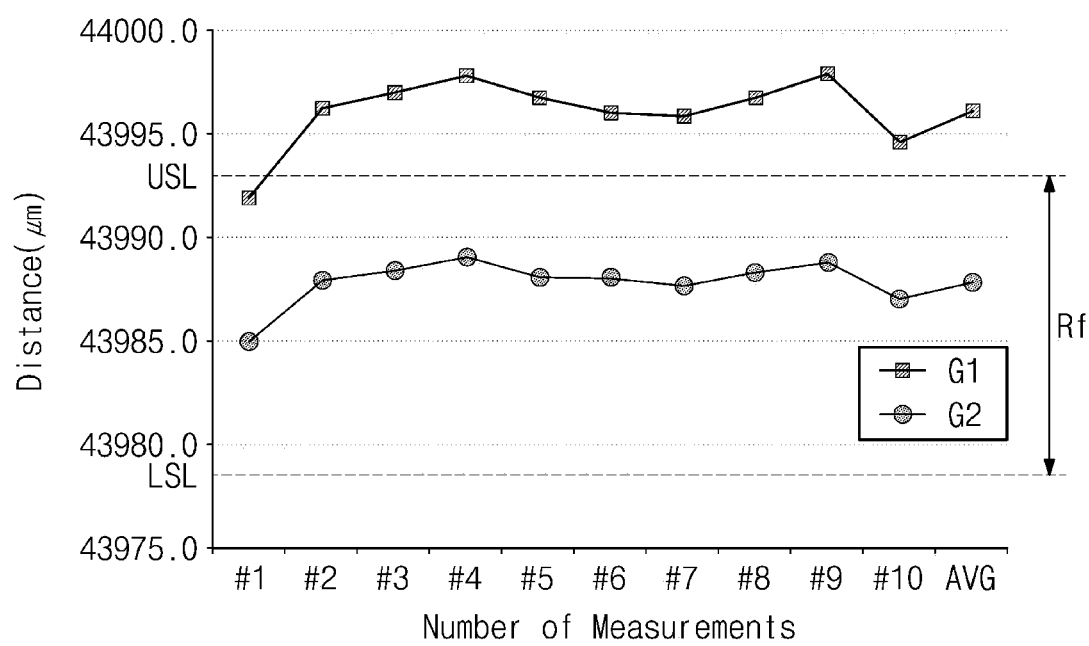
FIG. 10 is a graph comparing a process error of a film package according to an embodiment with a process error of an existing film package.

FIG. 10 is a graph comparing a process error of a film package according to an embodiment with a process error of an existing film package. In FIG. 10, a first graph G1 shows the distance between the first and second compare measurement pads (not shown), in a case that the first and second compare measurement pads may be positioned or disposed outer than the test pad T-PD. A second graph G2 shows the distance between the first and second measurement pads M-PD3 and M-PD4 (refer to FIG. 9A), in a case that the first and second measurement pads M-PD3 and M-PD4 may be positioned or disposed at points having the first interval d1 from the cutting line CLL. In the first graph G1, the first and second compare measurement pads may be separated from the cutting line CLL by an about 6 mm to about 7 mm interval, and, in the second graph G2, the first and second measurement pads M-PD3 and M-PD4 may be separated from the cutting line CLL by an about 300 μm interval.

With reference to FIG. 10, the actual pitch of the flexible circuit film FCB (see FIG. 3A) may be within a reference range Rf. Here, the actual pitch may be defined as the distance between the first connection pad and the last connection pad among the connection pads C-PD (see FIG. 3B). As an example, the minimum value LSL of the reference range Rf may be about 43978.7 μm and the maximum value USL may be about 43992.7 μm.

According to the first graph G1, in a case that the first and second compare measurement pads may be positioned or disposed outer than the test pads T-PD, the measured distance between the first and second compare measurement pads shows values positioned outside of or adjacent to the reference range Rf in nine measurements except the first measurement among all ten measurements.

However, according to the second graph G2, in a case that the first and second measurement pads M-PD3 and M-PD4 may be separated from the cutting line CLL by about 300 μm, the distance between the first and second measurement pads M-PD3 and M-PD4 shows values positioned within the reference range Rf in all ten measurements.

In other words, as the first and second measurement pads M-PD3 and M-PD4 may be closer to the cutting line CLL, the distance between the first and second measurement pads M-PD3 and M-PD4 show substantially the same value as the actual pitch of the flexible circuit film FCB.

In a case that the first and second measurement pads M-PD3 and M-PD4 may be disposed outside of or adjacent to the cutting line CLL, the first and second measurement pads M-PD3 and M-PD4 may be disposed between the test pads T-PD and the connection pads C-PD, and be disposed closer to the cutting line CLL than to the test pads T-PD.

Accordingly, an error between the actual pitch of the flexible circuit film FCB and the measured distance between the first and second measurement pads M-PD3 and M-PD4 may be minimized, and as a result, the misalignment between the flexible circuit film FCB and the display panel DP may be prevented.

According to the embodiment, the measurement pads that may measure the actual pitch of the flexible circuit film may be provided or disposed to the flexible circuit film, and thus the actual pitch of the flexible circuit film may be accurately measured. In a case that the measurement pads that may measure the actual pitch of the flexible circuit film may be disposed outside of or adjacent to the cutting line, the measurement pads may be disposed between the test pads and the cutting line, and thus, a value close to the actual pitch of the flexible circuit film may be measured.

Accordingly, the misalignment between the flexible circuit film and the display panel may be prevented, and thus, the connection reliability between the flexible circuit film and the display panel may be improved.

Although embodiments have been described, it is understood that the disclosure should not be limited to these embodiments but various changes and modifications may be made by one of ordinary skill in the art within the spirit and scope of the disclosure as hereinafter claimed.

What is claimed is:
1. A display device comprising:
  a display panel comprising a display area that displays an image and a pad area disposed at least at a side of the display area; and
  a flexible circuit film electrically connected to the pad area, the flexible circuit film comprising:
    connection pads arrayed in a first direction and inclined with respect to a reference line extending in a second direction different from the first direction; and
    a measurement pad disposed adjacent to a first side of the connection pads,
  wherein the measurement pad is parallel to the reference line,
  wherein the connection pads comprise:
    a first connection pad group having a first slope with respect to the reference line and comprising first connection pads disposed at a first side of the reference line; and
    a second connection pad group having a second slope with respect to the reference line and comprising second connection pads disposed at a second side of the reference line.

2. The display device of claim 1, wherein the flexible circuit film comprises:
  dummy pads disposed adjacent to the connection pads,
  wherein the dummy pads are inclined with respect to the reference line.

3. The display device of claim 2, wherein the dummy pads are
  disposed between the measurement pad and a connection pad disposed first in the first direction among the connection pads.

4. The display device of claim 1, wherein the connection pads further comprise:
  a third connection pad group having a third slope with respect to the reference line and disposed between the reference line and the first connection pad group; and
  a fourth connection pad group having a fourth slope with respect to the reference line and disposed between the reference line and the second connection pad group.

5. The display device of claim 4, wherein
  the third slope is greater than the first slope, and
  the fourth slope is greater than the second slope.

6. The display device of claim 1, wherein the measurement pad has a rectangular or square shape in a plan view.

7. The display device of claim 1, wherein the display panel comprises display pads disposed in the pad area corresponding to the connection pads,
  wherein the display pads are inclined with respect to the reference line.

8. The display device of claim 1, further comprising:
  a driving chip disposed on the flexible circuit film, the driving chip outputting a driving signal that drives the display panel,
  wherein the driving signal is provided to the display panel through the connection pads.

9. A film package comprising:
  a base film comprising a test area and a cutting area;
  connection pads disposed in the cutting area of the base film, arrayed in a first direction, and inclined with respect to a reference line extending in a second direction different from the first direction;
  test pads disposed in the test area of the base film and electrically connected to the connection pads through extension lines extended from the connection pads; and
  a measurement pad disposed in the test area of the base film and adjacent to a extension line disposed first in the first direction among the extension lines,
  wherein the measurement pad is disposed between the test pads and the connection pads, wherein
  the cutting area is defined by a cutting line,
  the measurement pad is separated from the cutting line by a first interval, the test pads are separated from the cutting line by a second interval, and the first interval is smaller than the second interval.

10. The film package of claim 9, wherein the first interval is greater than about 0 μm and smaller than about 500 μm.

11. The film package of claim 9, wherein the measurement pad is parallel to the reference line.

12. A film package comprising:

a base film comprising a test area and a cutting area;

connection pads disposed in the cutting area of the base film, arrayed in a first direction, and inclined with respect to a reference line extending in a second direction different from the first direction;

test pads disposed in the test area of the base film and electrically connected to the connection pads through extension lines extended from the connection pads; and a measurement pad disposed in the cutting area of the base film and adjacent to a connection pad disposed first in the first direction among the connection pads, the measurement pad is parallel to the reference line.

13. The film package of claim 12, further comprising:

dummy pads disposed adjacent to connection pads, wherein the dummy pads are inclined with respect to the reference line.

14. The film package of claim 13, wherein the dummy pads are disposed between the measurement pad and the first connection pad.

* * * * *